(12) United States Patent
Ko et al.

(10) Patent No.: US 10,157,739 B2
(45) Date of Patent: *Dec. 18, 2018

(54) ORIENTATION LAYER FOR DIRECTED SELF-ASSEMBLY PATTERNING PROCESS

(71) Applicant: Taiwan Semiconductor Manufacturing Company, Ltd., Hsinchu (TW)

(72) Inventors: Tsung-Han Ko, Hsin-Chu (TW); Ching-Yu Chang, Hsin-Chu (TW); Kuan-Hsin Lo, Nantou County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/875,788

(22) Filed: Jan. 19, 2018

(65) Prior Publication Data

US 2018/0144928 A1     May 24, 2018

Related U.S. Application Data

(62) Division of application No. 14/918,310, filed on Oct. 20, 2015, now Pat. No. 9,892,914.

(51) Int. Cl.
*H01L 21/027*     (2006.01)
*H01L 21/02*     (2006.01)
(Continued)

(52) U.S. Cl.
CPC ........ *H01L 21/0271* (2013.01); *G03F 7/0002* (2013.01); *H01L 21/02118* (2013.01);
(Continued)

(58) Field of Classification Search
CPC .... B81C 2201/0149; G03D 5/04; G03D 5/06; H01L 21/0271; H01L 21/02118;
(Continued)

(56) References Cited

U.S. PATENT DOCUMENTS 8,216,767 B2    7/2012   Wang et al.
8,323,870 B2    12/2012   Lee et al.
(Continued)

OTHER PUBLICATIONS

Somervell, Mark et al., "Comparison of Directed Self-Assembly Integrations," Prod. of SPIE, vol. 8325 83250G-1, 2012 (14 pages).

*Primary Examiner* — Mohammed Shamsuzzaman
(74) *Attorney, Agent, or Firm* — Haynes and Boone, LLP

(57) ABSTRACT

Disclosed is a method of forming a semiconductor device using a self-assembly (DSA) patterning process. The method includes forming a patterned feature over a substrate; applying an orientation material that includes a first polymer and a second polymer over the substrate, wherein the first polymer has a first activation energy and the second polymer has a second activation energy; baking the substrate at first temperature thereby forming a first orientation layer that includes the first polymer; baking the substrate at second temperature thereby forming a second orientation layer that includes the second polymer; and performing a directed self-assembly (DSA) process over the first and the second orientation layers.

18 Claims, 13 Drawing Sheets

(51) Int. Cl.
*H01L 21/311* (2006.01)
*G03F 7/00* (2006.01)

(52) U.S. Cl.
CPC .. *H01L 21/02315* (2013.01); *H01L 21/02318* (2013.01); *H01L 21/02356* (2013.01); *H01L 21/31138* (2013.01); *B81C 2201/0149* (2013.01)

(58) Field of Classification Search
CPC ......... H01L 21/02315; H01L 21/02318; H01L 21/02356; H01L 21/31138; G03F 7/0002
USPC ........ 438/703, 761, 781, 700, 694; 430/296; 257/40, 72
See application file for complete search history.

(56) References Cited

U.S. PATENT DOCUMENTS

| | | | |
|---|---|---|---|
| 8,580,117 B2 | 11/2013 | Kao et al. | |
| 8,647,814 B2* | 2/2014 | Dravid | G03F 7/405 250/492.3 |
| 8,658,344 B2 | 2/2014 | Wang et al. | |
| 8,715,919 B2 | 5/2014 | Chang et al. | |
| 8,741,551 B2 | 6/2014 | Wu et al. | |
| 9,632,408 B1* | 4/2017 | Cottle | H01L 21/0271 |
| 2003/0180472 A1* | 9/2003 | Zhou | B05D 1/18 427/430.1 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0087566 A1* | 3/2014 | Kato | B81C 1/00031 438/761 |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2014/0315390 A1* | 10/2014 | Abdallah | H01L 21/3081 438/703 |
| 2014/0370717 A1* | 12/2014 | Chakrapani | H01L 21/31138 438/725 |
| 2015/0227046 A1* | 8/2015 | Park | G03F 7/168 430/315 |
| 2016/0304740 A1* | 10/2016 | Cheng | C09D 169/00 |
| 2017/0110319 A1 | 4/2017 | Ko et al. | |

\* cited by examiner

ORIENTATION LAYER FOR DIRECTED SELF-ASSEMBLY PATTERNING PROCESS

The present application is a divisional application of U.S. application Ser. No. 14/918,310 filed on Oct. 20, 2015, which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as optical lithography approaches its technological and economical limits, a directed self-assembly (DSA) process emerges as a potential candidate for patterning dense features. A DSA process takes advantage of the self-assembling properties of materials, such as block copolymers (BCP), to reach nanoscale dimensions while meeting the constraints of current manufacturing. However, while existing DSA processes have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
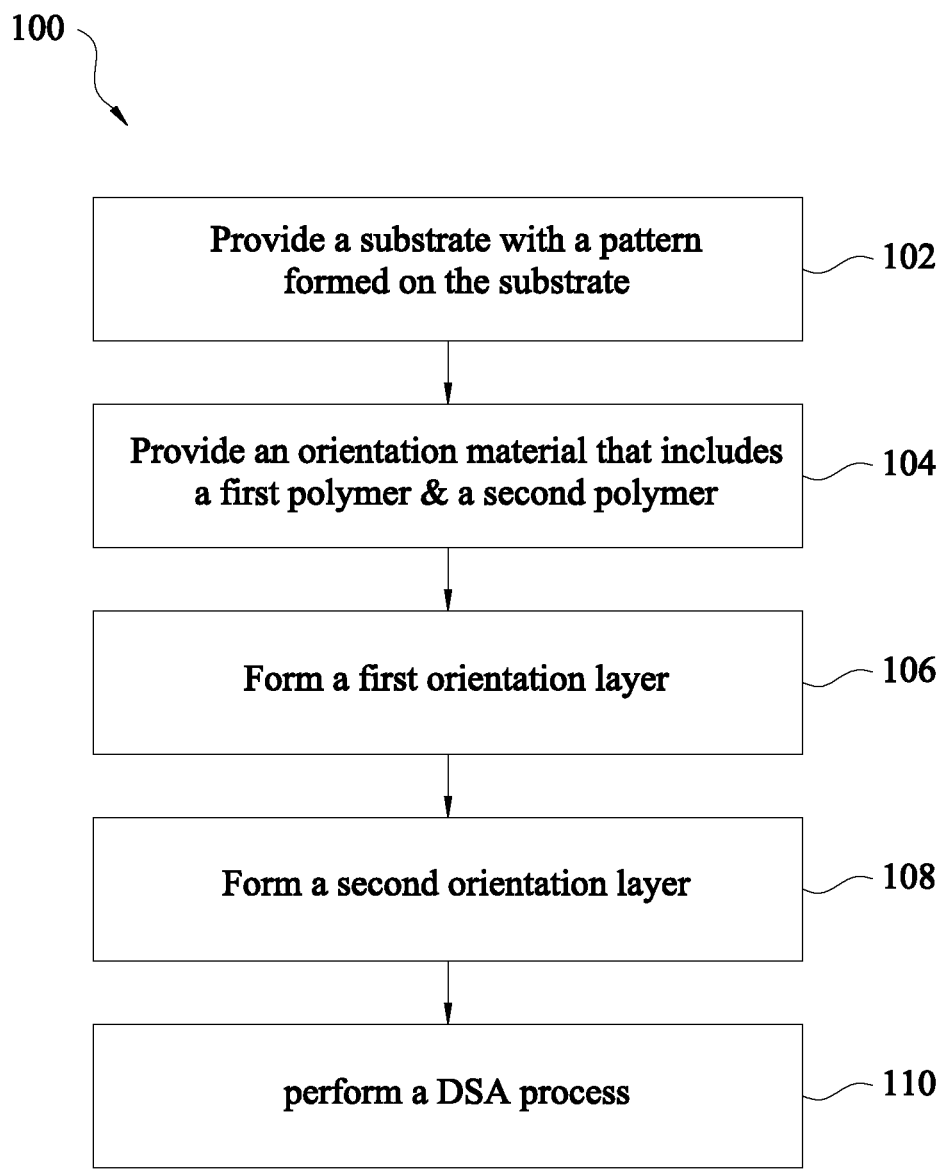
FIG. 1 shows a flow chart of a method of fabricating a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to methods for manufacturing semiconductor devices with dense and nanoscale patterns. When fabricating dense patterns, a directed self-assembly (DSA) process may be used to enhance and augment the existing semiconductor manufacturing capabilities. In a typical DSA process, a block copolymer (BCP) film is formed over lithographically defined surfaces and a microphase separation is induced to cause the constituent polymer molecules to self-assemble, thus creating densely packed features with uniform dimensions and shapes. A BCP film or simply a BCP includes polymers comprised of at least two different polymer segments. These polymer segments are configured to assemble themselves into highly ordered structures under certain conditions such as for example, when they are exposed to an elevated temperature. In general, a neutral layer or an orientation layer is disposed on a surface of a substrate of a lithographically defined surface before forming the BCP film. The neutral layer has no affinity for either of the polymer segments of the BCP film. During a DSA process, the neutral layer may be able to lead/orientate a first polymer segment for directed self-assembly. However, in order to orientate a second polymer segment for directed self-assembly, at least one additional process (e.g., forming another neutral layer using the additional process to orientate the second polymer segment) is required. The forming the another neutral layer generally includes multiple process to be involved such as for example, removing part of the neutral layer that leads the first polymer segment, providing a pattern for the neutral layer that is to lead the second polymer segment, and removing the patterned neutral layer. In contrast, the present disclosure provides various embodiments of a method to form an improved neutral layer without requiring the above-identified additional processes.

Referring now to FIG. 1, a flow chart of a method 100 of forming a semiconductor device is illustrated according to various aspects of the present disclosure. Additional operations can be provided before, during, and after the method 100, and some operations described can be replaced, eliminated, or moved around for additional embodiments of the method. The method 100 is briefly described below. Then, some embodiments of the method 100 will be described in conjunction with FIGS. 2A, 2B, 2C, 2D, 2E, and 3.

Figure 2A:
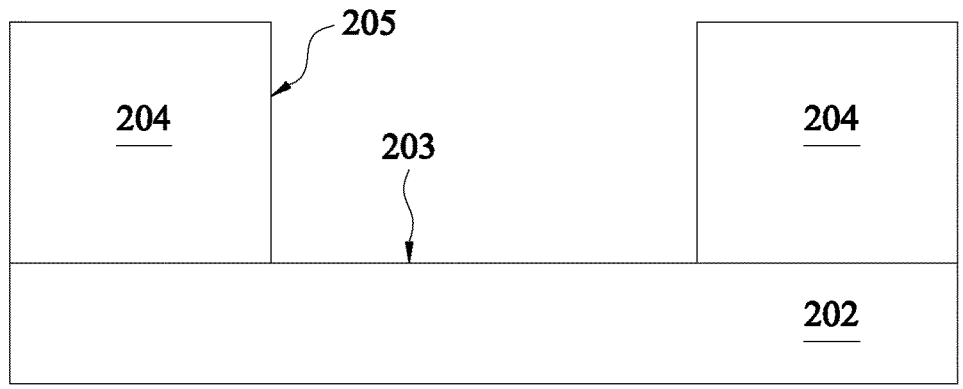
FIGS. 2A-2E are cross sectional views of forming a semiconductor device according to the method of FIG. 1 in accordance with some embodiments.

Referring to FIGS. 1 and 2A, the method 100 begins at operation 102 by providing a substrate 202 with a pattern 204. The substrate 202 may include one or more layers of material or composition. For example, the substrate 202 may include an elementary semiconductor, such as silicon and germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. The substrate 202 may also include an epitaxial layer. For example, the substrate 202 may have an epitaxial layer overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX) or other suitable technique, such as wafer bonding and grinding. In some other embodiments, the substrate 202 may further include a top layer (not shown) overlaying a top surface of the substrate 202. As such, the top layer may include silicon oxide, silicon nitride, oxynitride, silicon carbide, titanium oxide, titanium nitride, tantalum oxide, tantalum nitride, and/or any suitable materials.

In the illustrated embodiment of FIG. 2A, pattern 204 may be a resist layer (e.g., a photoresist layer). The resist layer may be a positive resist or a negative resist, and may be a resist suitable for deep ultraviolet (DUV), extreme ultraviolet (EUV), electron beam (e-beam), and/or other lithography processes. In some specific embodiments, pattern 204 is formed of organic materials. While still falling within the scope of the present disclosure, the pattern 204 may be formed of one of a variety of materials that is suitable for forming a pattern. The pattern 204 may be formed by any suitable methods such as for example, a chemical vapor deposition (CVD) process, an atomic layer deposition (ALD) process, a spin-on coating, and/or any combination thereof.

Referring still to FIG. 2A, the substrate 202 includes an exposed top surface 203, and the pattern 204 includes a sidewall 205. According to the current embodiments, the top surface 203 of the substrate 202 and the sidewall 205 of the pattern 204 each includes a different surface characteristic. For example, the top surface 203 includes an oxidized surface which is more reactive while the sidewall 205 includes a surface that is formed of organic materials which is less reactive.

Figure 3:
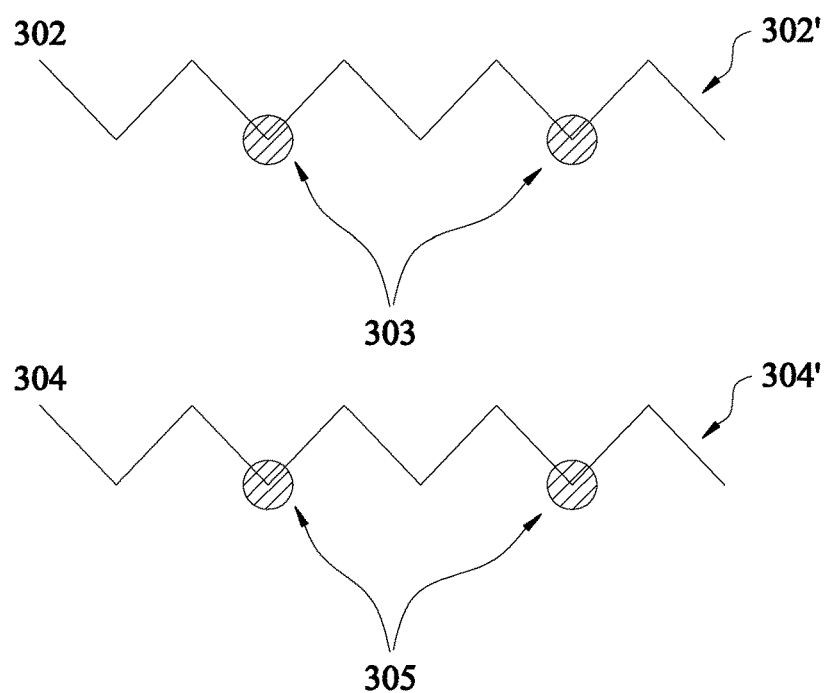
FIG. 3 shows a schematic view of the orientation material that is used in the method of FIG. 1 in accordance with some embodiments.

Referring to FIG. 1, the method 100 proceeds to operation 104 by providing an orientation layer that is formed of at least two polymers (e.g., a first polymer and a second polymer). In an embodiment, as illustrated in FIG. 3, the orientation layer includes a first polymer 302 and a second polymer 304. More specifically, the first polymer 302 includes a polymer backbone 302' and at least an atom/unit of the backbone 302' is replaced with or modified by a group 303; and the second polymer 304 includes a polymer backbone 304' and at least an atom/unit of the backbone 304' is replaced with or modified by a group 305. The group 303 is a hydroxyl group with a higher amount of carbon side chains (e.g., carbon side chains >4) and the group 305 is a hydroxyl group with a lower amount of carbon side chains (e.g., carbon side chains <2). As such, the first polymer 302 may have a lower activation energy than the second polymer 304 may have. That is, the first polymer 302 with the lower activation energy may be activated at a first elevated temperature and the second polymer 304 with the higher activation energy may be activated at a second elevated temperature, wherein the first elevated temperature is lower than the second elevated temperature.

Figure 2B:
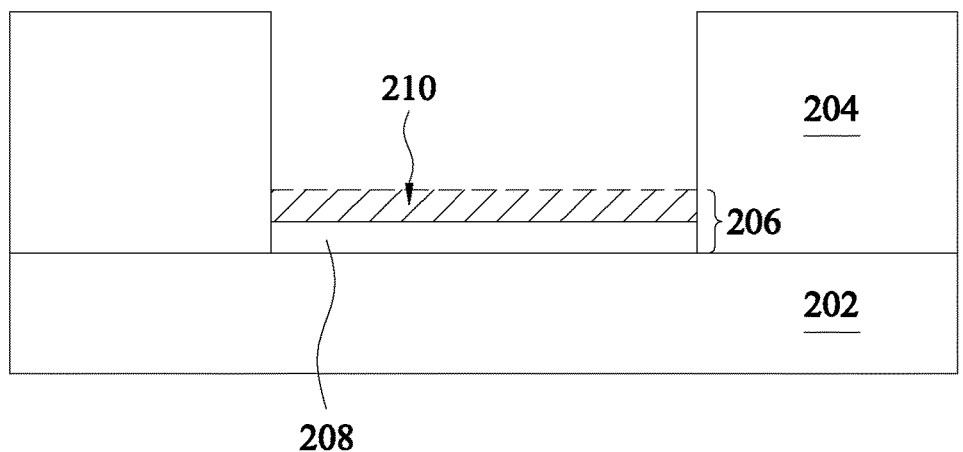

Referring to FIGS. 1 and 2B, the method 100 proceeds to operation 106 with forming a first orientation layer 208. In the example of the orientation material is formed of the polymers 302 and 304 with respect to FIG. 3, as illustrated in FIG. 2B, an orientation layer 208 is formed on the top surface 203 of the substrate by baking the substrate to temperature between about 80° C. and about 150° C., wherein the orientation layer 208 is formed of the first polymer 302 (lower activation energy). In some embodiments, during the formation of the orientation layer 208, another portion (higher activation energy) of the orientation material (i.e., the portion formed of the second polymer 304) may float above the formed orientation layer 208, illustrated as 210 in FIG. 2B. That is, the portion 210 has not been formed as an orientation layer yet in operation 106. In some embodiments, the orientation layer 208 may have a thickness ranging between about 5 nanometers to about 10 nanometers.

Figure 2C:
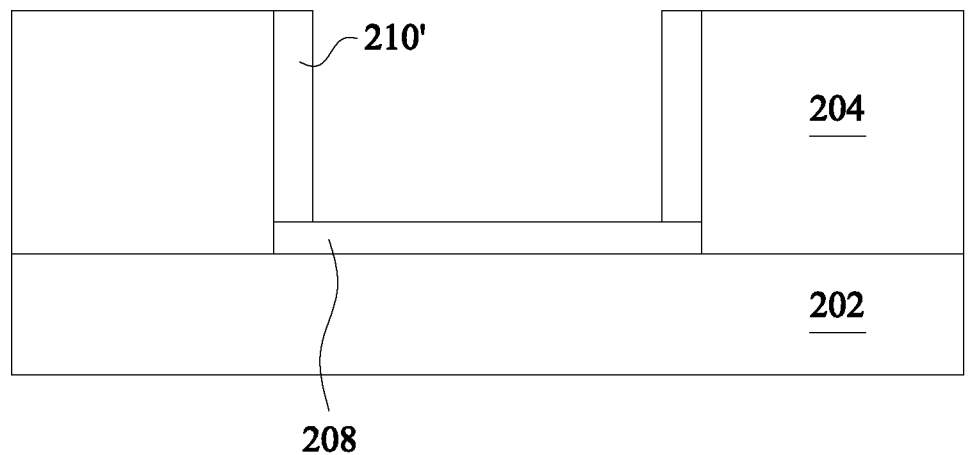

The method 100 continues to operation 108 with forming a second orientation layer. Continuing with the above example in which the orientation material is formed of the polymers in FIG. 3, a second orientation layer 210' that is formed of the second polymer 304 is formed on the sidewall 205 by baking the substrate to temperature between about 180° C. and about 250° C. as illustrated in the embodiment of FIG. 2C.

Figure 2D:
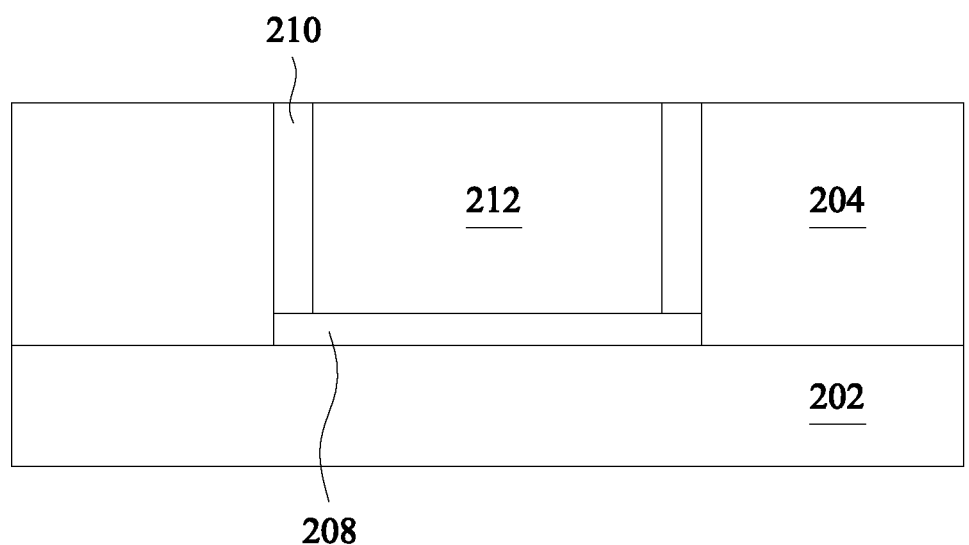
Figure 2E:
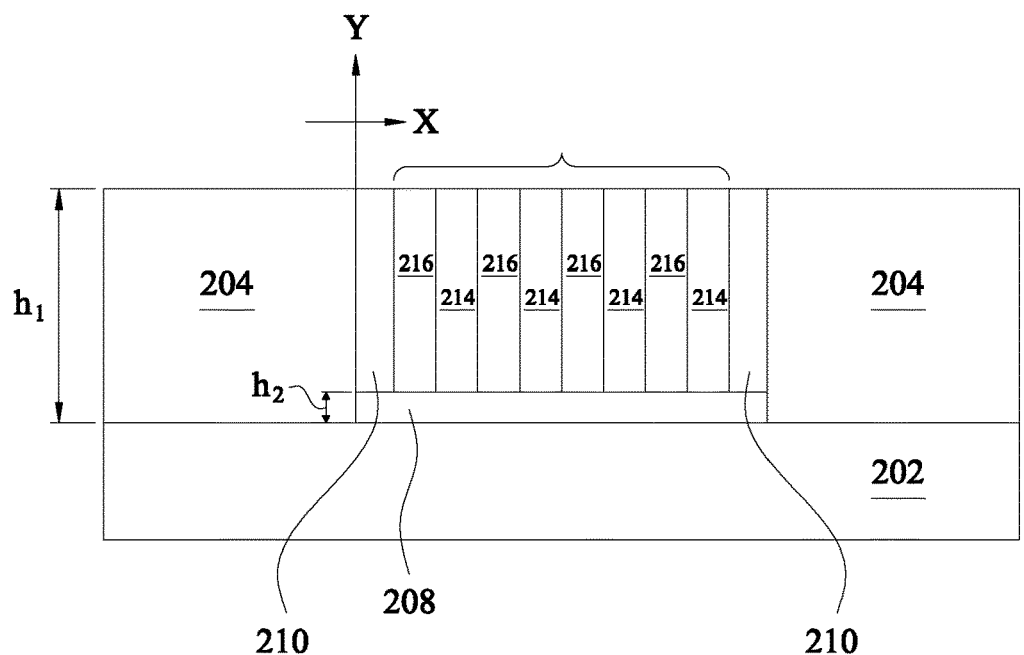

The method 100 proceeds to operation 110 with performing a directed self-assembly (DSA) process. In some embodiments, the operation 110 may include multiple processes in the following order: depositing a directed self-assembly (DSA) block copolymer (BCP) layer 212 over the first orientation layer 208 and the second orientation layer 210 (as illustrated in FIG. 2D); applying an elevated temperature to anneal the BCP layer 212 thereby achieving segregation in the BCP layer 212 to form first and second polymer nanostructures, 214 and 216 (as illustrated in FIG. 2E). Generally, a BCP material includes polymers comprised of at least two different polymer segments, and these polymer segments can assemble themselves into highly ordered structures under certain conditions, such as when they are exposed to an elevated temperature. In the current embodiment, the BCP layer 212 may include one or more of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyviny.

Still referring to FIGS. 1 and 2E, during the DSA process (i.e., operation 110), by choosing the height of the pattern 204 (i.e., $h_1$), the height of the first orientation layer 208 (i.e., $h_2$), and the materials of the BCP layer 212, the first and second polymer nanostructures 214 and 216 are formed such that they have a height approximately same as the difference of the heights $h_1$ and $h_2$, they are parallel to each other. In the illustrated embodiment of FIG. 2E, the first and second polymer nanostructures 214 and 216 are aligned along direction X, and each of them extends in a direction (i.e., Y axis in FIG. 2E) that is parallel to the sidewall 205. However, the BCP layer 212 may be formed into a variety of shapes that are regularly aligned such as for example, a sphere, a cylinder, a lamellae, and any suitable shape known in the art. The formed polymer nanostructures 214 and 216 may be later used as a pattern for a further fabrication step. In an example, one of the polymer nanostructures (e.g., 214) may be etched away and the other polymer nanostructure (e.g., 216) may be left on the substrate as a hard mask layer to transfer a pattern onto the substrate thereby reaching a finer critical dimension (CD).

Figure 4:
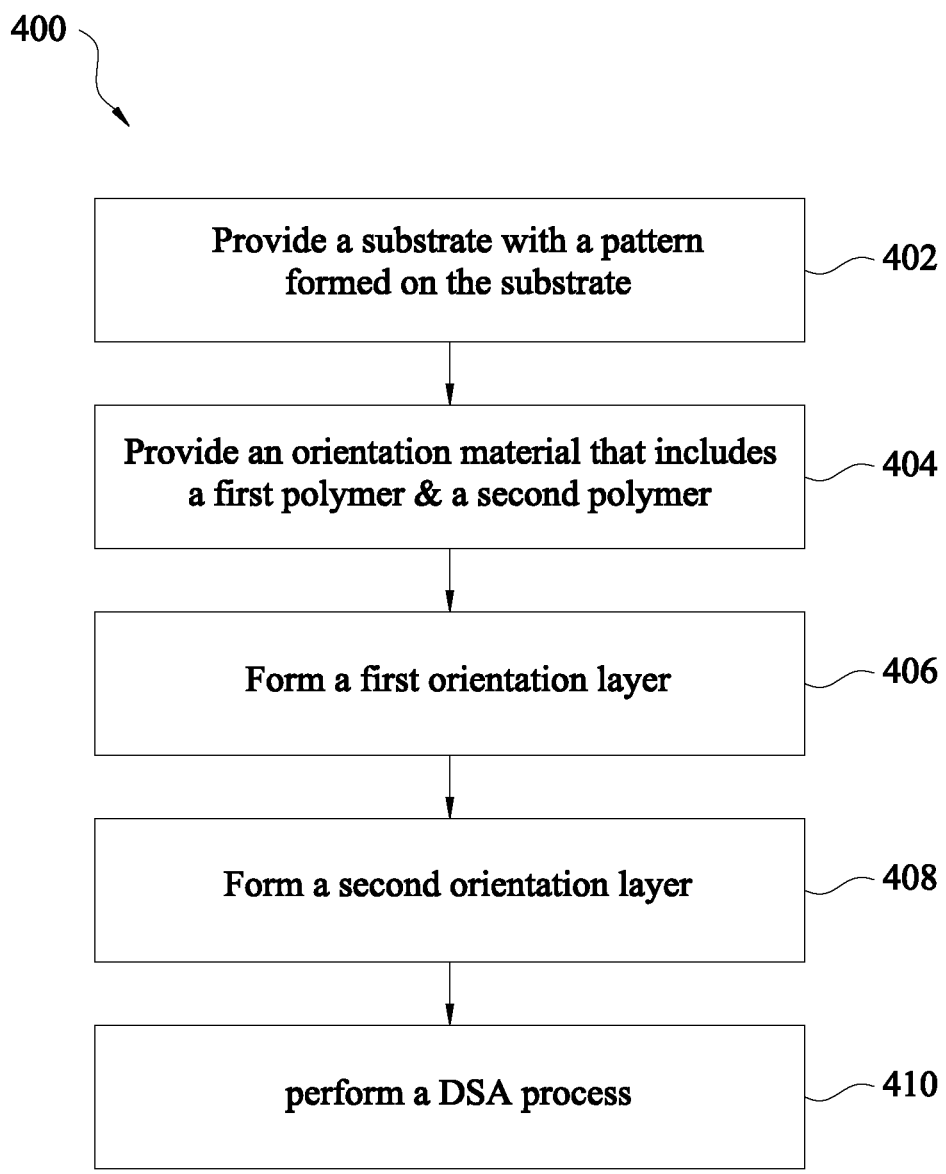
FIG. 4 shows a flow chart of a method of fabricating a semiconductor device, according to various aspects of the present disclosure.

Referring now to FIG. 4, a flow chart of another method 400 of forming a semiconductor device is illustrated according to various aspects of the present disclosure. Additional operations can be provided before, during, and after the method 400, and some operations described can be replaced, eliminated, or moved around for additional embodiments of the method. The method 400 is briefly described below. Then, some embodiments of the method 400 will be described in conjunction with FIGS. 5A, 5B, 5C, 5D, 5E, and 6.

Figure 5A:
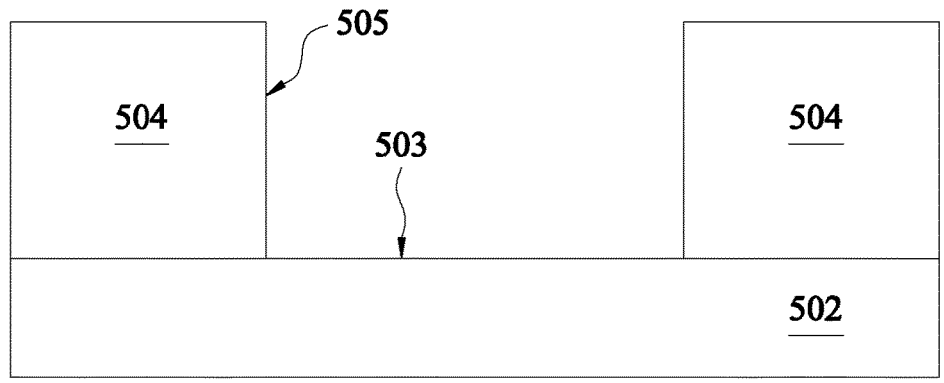
FIGS. 5A-5E are cross sectional views of forming a semiconductor device according to the method of FIG. 4 in accordance with some embodiments.

Referring to FIGS. 4 and 5A, the method 400 begins at operation 402 by providing a substrate 502 with a pattern 504. The substrate 502 may include one or more layers of material or composition. For example, the substrate 502 may include an elementary semiconductor, such as silicon and germanium. The substrate 502 may also include a compound semiconductor such as silicon carbide, gallium arsenic, indium arsenide, and indium phosphide. The substrate 502 may include an alloy semiconductor such as silicon germanium, silicon germanium carbide, gallium arsenic phosphide, and gallium indium phosphide. The substrate 502 may also include an epitaxial layer. For example, the substrate 502 may have an epitaxial layer overlying a bulk semiconductor. Furthermore, the substrate 502 may include a semiconductor-on-insulator (SOI) structure. For example, the substrate 502 may include a buried oxide (BOX) layer formed by a process such as separation by implanted oxygen (SIMOX) or other suitable technique, such as wafer bonding and grinding. In some other embodiments, the substrate 502 may further include a top layer (not shown) overlaying a top surface of the substrate 502. As such, the top layer may include silicon oxide, silicon nitride, oxynitride, silicon carbide, titanium oxide, titanium nitride, tantalum oxide, tantalum nitride, and/or any suitable materials.

In the illustrated embodiment of FIG. 5A, pattern 504 may be a resist layer (e.g., a photoresist layer). The resist layer may be a positive resist or a negative resist, and may be a resist suitable for deep ultraviolet (DUV), extreme ultraviolet (EUV), electron beam (e-beam), and/or other lithography processes. In some specific embodiments, pattern 504 is formed of organic materials. While still falling within the scope of the present disclosure, the pattern 504 may be formed of one of a variety of materials that is suitable for forming a pattern. The pattern 504 may be formed by any suitable methods such as for example, a chemical vapor deposition (CVD) process, an atomic layer deposition (ALD) process, a spin-on coating, and/or any combination thereof.

Referring still to FIG. 5A, the substrate 502 includes an exposed top surface 503, and the pattern 504 includes a sidewall 505. According to the current embodiments, the top surface 503 of the substrate 502 and the sidewall 505 of the pattern 504 each includes a different surface characteristic. For example, the top surface 503 includes an oxidized surface which is more reactive to a functional group (e.g., a hydroxyl group) while the sidewall 505 includes a surface that is formed of organic materials which is less reactive to the hydroxyl group but more reactive to another functional group (e.g., an aromatic group).

Figure 6:
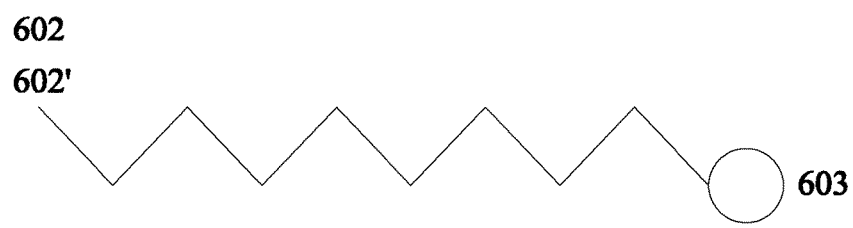
FIG. 6 shows a schematic view of the orientation material that is used in the method of FIG. 4 in accordance with some embodiments.
Figure 6:
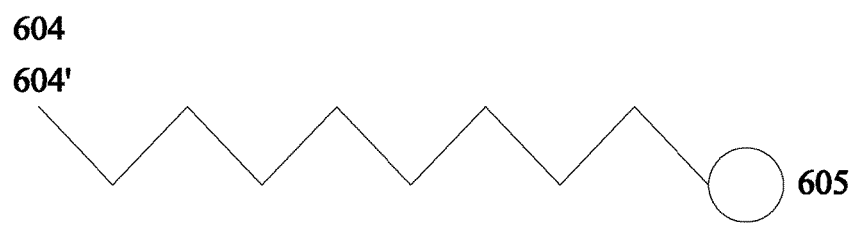

Referring to FIG. 4, the method 400 proceeds to operation 404 by providing an orientation material that is formed of at least two polymers (e.g., a first polymer and a second polymer). In an embodiment, as illustrated in FIG. 6, the orientation material includes a first polymer 602 and a second polymer 604. More specifically, the first polymer 602 includes a polymer backbone 602' and the polymer backbone 602' is terminated with a functional group 603; and the second polymer 604 includes a polymer backbone 604' and the polymer backbone 604' is terminated with a functional group 605. The functional group 603 includes at least a hydroxyl group, a carboxyl group, and/or an amide group; the functional group 605 includes at least an aromatic group.

Figure 5B:
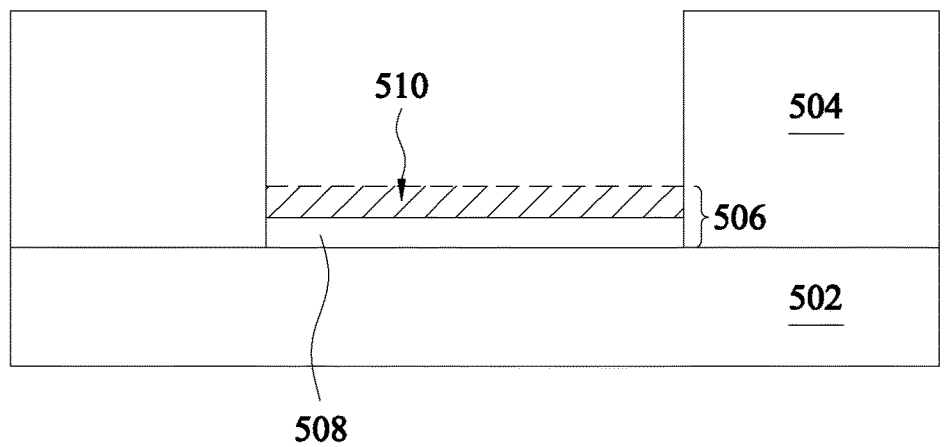

Referring to FIGS. 4 and 5B, the method 400 proceeds to operation 406 with forming a first orientation layer 508. In the example of the orientation material is formed of the polymers 602 and 604 with respect to FIG. 6, as illustrated in FIG. 5B, an orientation layer 508 is formed on the top surface 503 of the substrate, wherein the orientation layer 508 is formed of the first polymer 602. In some embodiments, during the formation of the orientation layer 508, another portion of the orientation material (i.e., the portion formed of the second polymer 604) may float above the formed orientation layer 508, which is illustrated as 510 in FIG. 5B. That is, the portion 510 has not been formed as an orientation layer yet in operation 406. In some embodiments, the orientation layer 508 may have a thickness ranging between about 5 nanometers to about 10 nanometers.

Figure 5C:
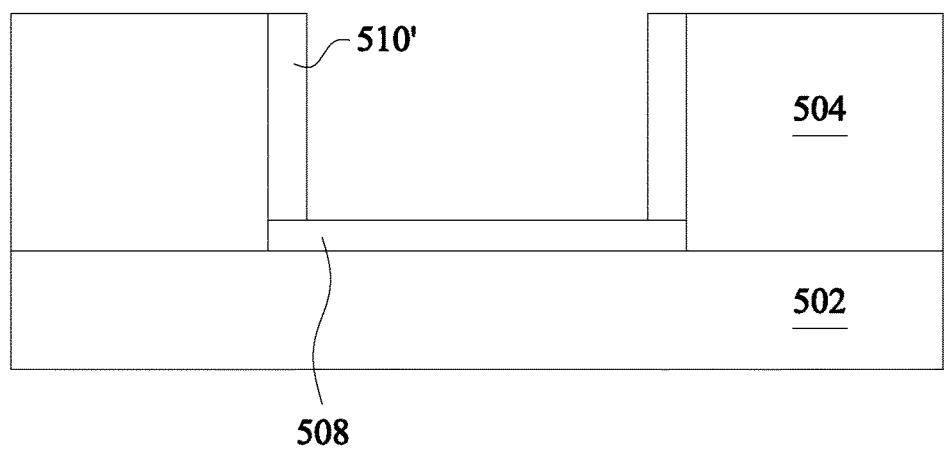

The method 400 continues to operation 408 with forming a second orientation layer. Continuing with the above example in which the orientation material is formed of the polymers in FIG. 6, a second orientation layer 610' that is formed of the second polymer 604 is formed on the sidewall 605 by baking the substrate to temperature between about 180° C. and about 250° C. as illustrated in the embodiment of FIG. 5C.

Figure 5D:
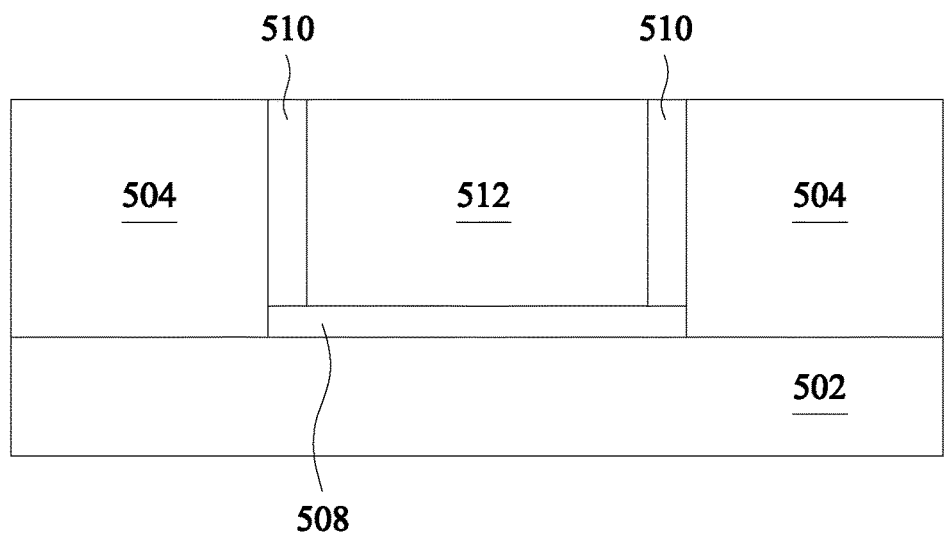
Figure 5E:
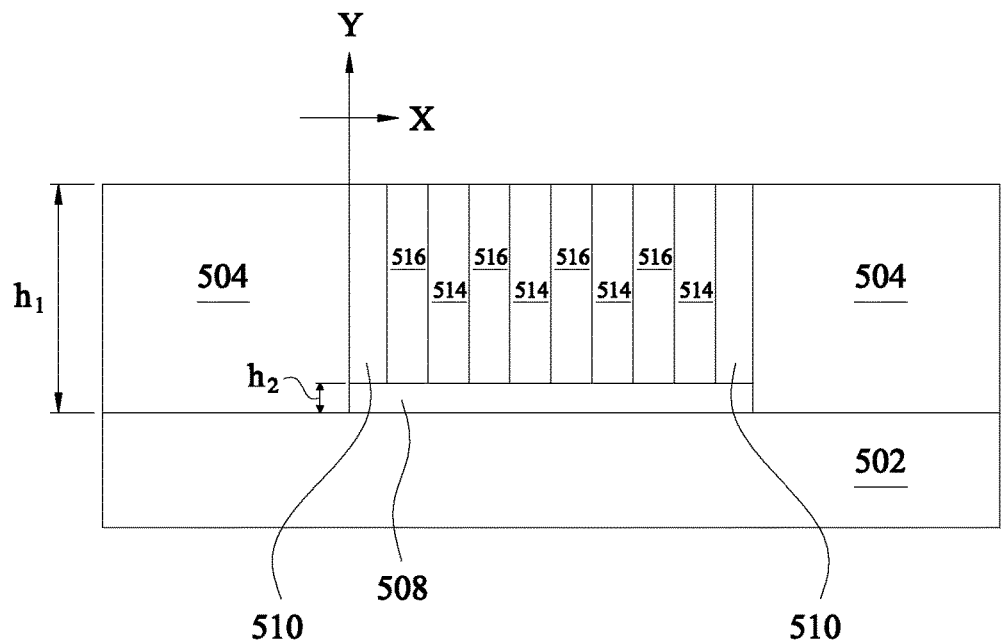

The method 400 proceeds to operation 410 with performing a directed self-assembly (DSA) process. In some embodiments, the operation 410 may include multiple processes in the following order: depositing a directed self-assembly (DSA) block copolymer (BCP) layer 512 over the first orientation layer 508 and the second orientation layer 510 (as illustrated in FIG. 5D); applying an elevated temperature to anneal the BCP layer 512 thereby achieving segregation in the BCP layer 512 to form first and second polymer nanostructures, 514 and 516 (as illustrated in FIG. 5E). Generally, a BCP material includes polymers comprised of at least two different polymer segments, and these polymer segments can assemble themselves into highly ordered structures under certain conditions, such as when they are exposed to an elevated temperature. In the current embodiment, the BCP layer 512 may include one or more of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyviny.

Still referring to FIGS. 4 and 5E, during the DSA process (i.e., operation 510), by choosing the height of the pattern 504 (i.e., $h_1$), the height of the first orientation layer 508 (i.e., $h_2$), and the materials of the BCP layer 512, the first and second polymer nanostructures 514 and 516 are formed such that they have a height approximately same as the difference of the heights $h_1$ and $h_2$, they are parallel to each other. In the illustrated embodiment of FIG. 5E, the first and second polymer nanostructures 514 and 516 are aligned along direction X, and each of them extends in a direction (i.e., Y axis in FIG. 5E) that is parallel to the sidewall 505. However, the BCP layer 512 may be formed into a variety of shapes that are regularly aligned such as for example, a sphere, a cylinder, a lamellae, and any suitable shape known in the art. The formed polymer nanostructures 514 and 516 may be later used as a pattern for a further fabrication step. In an example, one of the polymer nanostructures (e.g., 514) may be etched away and the other polymer nanostructure (e.g., 516) may be left on the substrate as a hard mask layer to transfer a pattern onto the substrate thereby reaching a finer critical dimension (CD).

Figure 7:
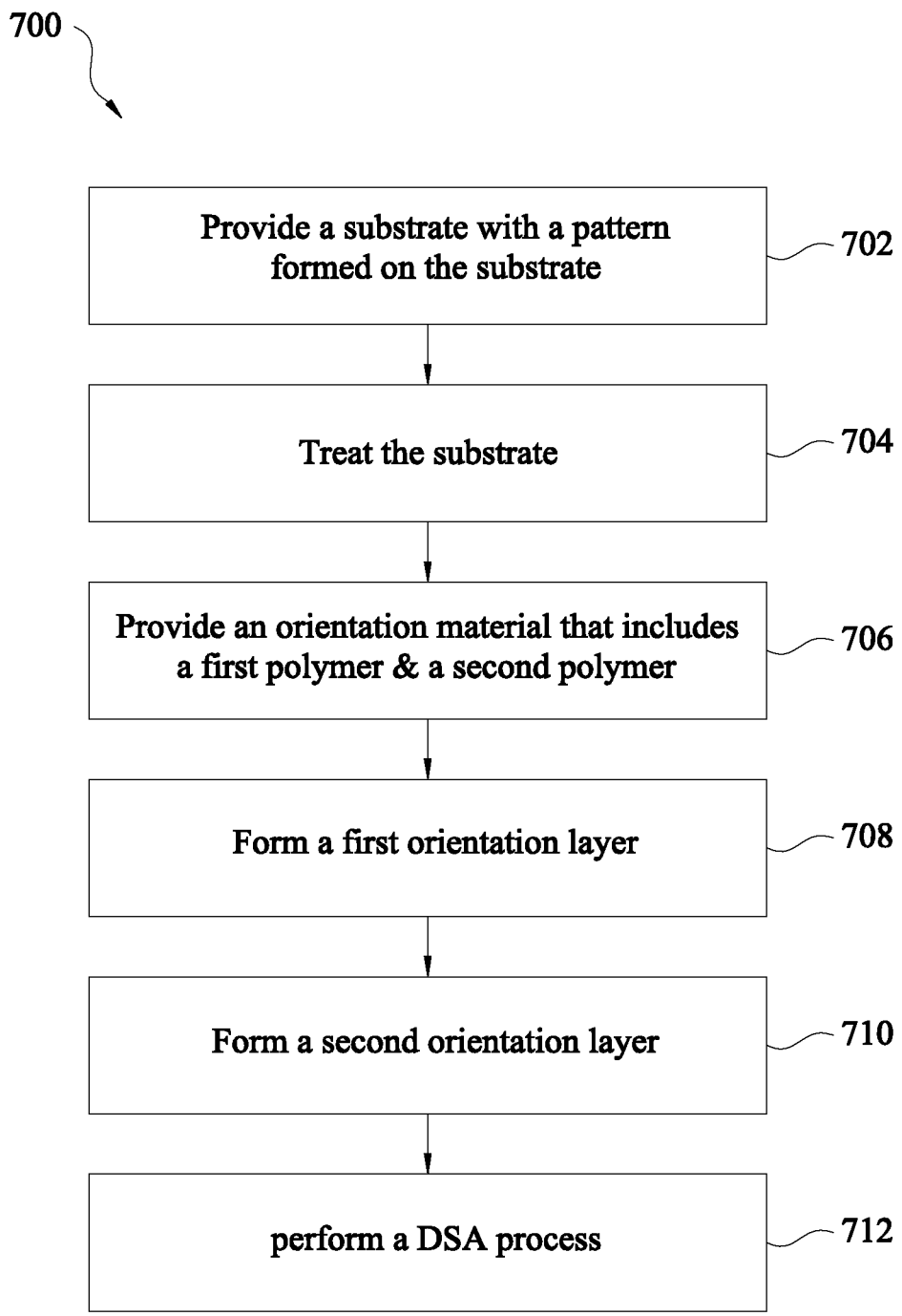
FIG. 7 shows a flow chart of a method of fabricating a semiconductor device, according to various aspects of the present disclosure.

Referring now to FIG. 7, a flow chart of yet another method 700 of forming a semiconductor device is illustrated according to various aspects of the present disclosure. Additional operations can be provided before, during, and after the method 700, and some operations described can be replaced, eliminated, or moved around for additional embodiments of the method. The method 700 is briefly described below. Then, some embodiments of the method 700 will be described in conjunction with FIGS. 8A, 8B, 8C, 8D, 8E, 8F, and 9.

Figure 8A:
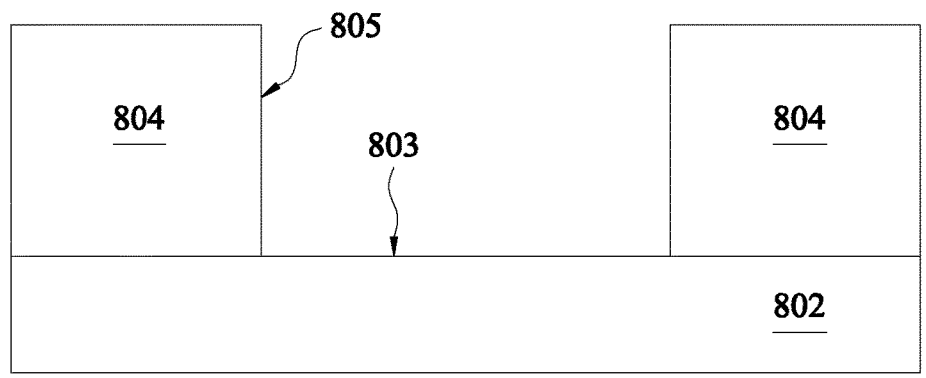
FIGS. 8A-8F are cross sectional views of forming a semiconductor device according to the method of FIG. 1 in accordance with some embodiments.

Referring to FIGS. 7 and 8A, the method 700 begins at operation 702 by providing a substrate 802 with a pattern 804. The substrate 802 may include one or more layers of material or composition. For example, the substrate 802 may include an elementary semiconductor, such as silicon and germanium. The substrate 802 may also include a compound semiconductor such as silicon carbide, gallium arsenic, indium arsenide, and indium phosphide. The substrate 802 may include an alloy semiconductor such as silicon germanium, silicon germanium carbide, gallium arsenic phosphide, and gallium indium phosphide. The substrate 802 may also include an epitaxial layer. For example, the substrate 802 may have an epitaxial layer overlying a bulk semiconductor. Furthermore, the substrate 802 may include a semiconductor-on-insulator (SOI) structure. For example, the substrate 802 may include a buried oxide (BOX) layer formed by a process such as separation by implanted oxygen (SIMOX) or other suitable technique, such as wafer bonding and grinding. In some other embodiments, the substrate 802 may further include a top layer (not shown) overlaying a top surface of the substrate 802. As such, the top layer may include silicon oxide, silicon nitride, oxynitride, silicon carbide, titanium oxide, titanium nitride, tantalum oxide, tantalum nitride, and/or any suitable materials.

In the illustrated embodiment of FIG. 8A, pattern 804 may be a resist layer (e.g., a photoresist layer). The resist layer may be a positive resist or a negative resist, and may be a resist suitable for deep ultraviolet (DUV), extreme ultraviolet (EUV), electron beam (e-beam), and/or other lithography processes. In some specific embodiments, pattern 804 is formed of organic materials. While still falling within the scope of the present disclosure, the pattern 804 may be formed of any of a variety of materials that is suitable for forming a pattern. The pattern 804 may be formed by any suitable methods such as for example, a chemical vapor deposition (CVD) process, an atomic layer deposition (ALD) process, a spin-on coating, and/or any combination thereof.

Referring still to FIG. 8A, the substrate 802 includes an exposed top surface 803, and the pattern 804 includes a sidewall 805. In some embodiments, the top surface 803 of the substrate 802 and the sidewall 805 of the pattern 804 each includes a different surface characteristic. However, in some alternative embodiments, the top surface 803 of the substrate 802 and the sidewall 805 of the pattern 804 may each have a substantial similar surface characteristic.

Figure 8B:
Figure 8B:
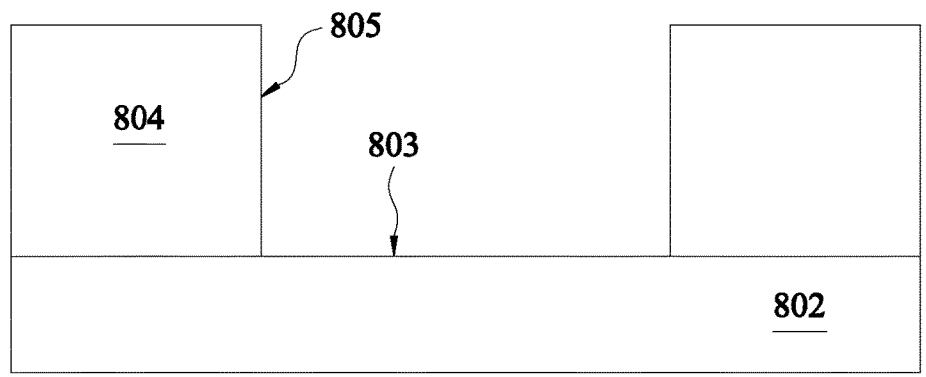

The method continues in operation 704 with applying a treatment 807 on the substrate 802 (more specifically, on the top surface 803 of the substrate), as illustrated in FIG. 8B. In some embodiments, the treatment 807 may include a plasma-assisted dry etching process by flowing $N_2/H_2$ and/or $O_2$. The etching process may be performed at temperature ranging from about 0° C. to about 80° C. and at pressure ranging from about 10 millitorr (mT) to about 60 mT. As illustrated in FIG. 8B, the etching process (i.e., 807) may be an anisotropic process (perpendicular to the top surface 803) and thus only the top surface is treated or only the top surface's surface characteristic is changed while the sidewall 805 remains intact. As such, after the treatment 807, the top surface 803 may include a hydrophilic surface while the sidewall 805 may include a hydrophobic surface.

Figure 9:
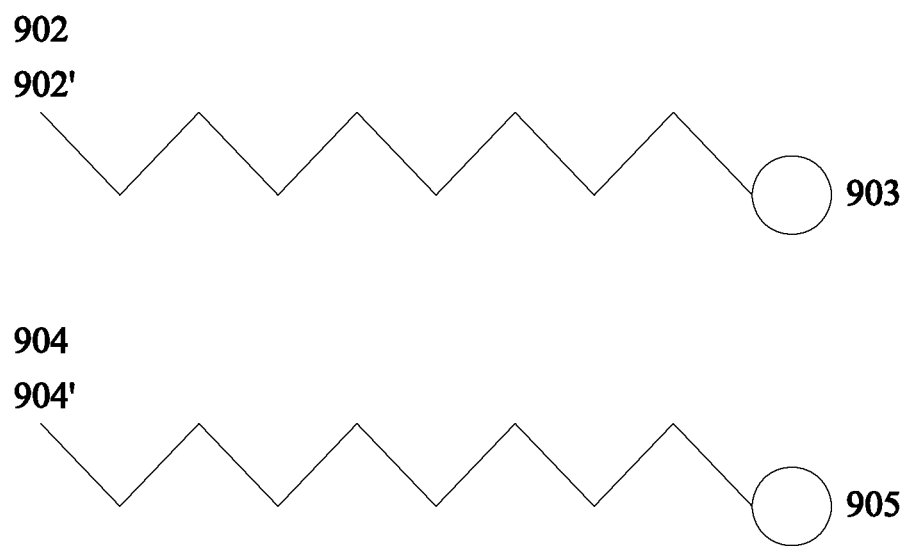
FIG. 9 shows a schematic view of the orientation material that is used in the method of FIG. 7 in accordance with some embodiments.

Referring to FIG. 7, the method 700 proceeds to operation 706 with providing an orientation material that is formed of at least two polymers (e.g., a first polymer and a second polymer). In an embodiment, as illustrated in FIG. 9, the orientation material includes a first polymer 902 and a second polymer 904. More specifically, the first polymer 902 includes a polymer backbone 902' and the polymer backbone 902' is terminated with a functional group 903; and the second polymer 904 includes a polymer backbone 904' and the polymer backbone 904' is terminated with a functional group 905. The functional group 903 is a hydrophilic group that is selected form a group consisting of a hydroxyl group, a carboxyl group, and an amide group; the functional group 905 is a hydrophobic group that is selected form a group consisting of a ketone group and an ether group.

Figure 8C:
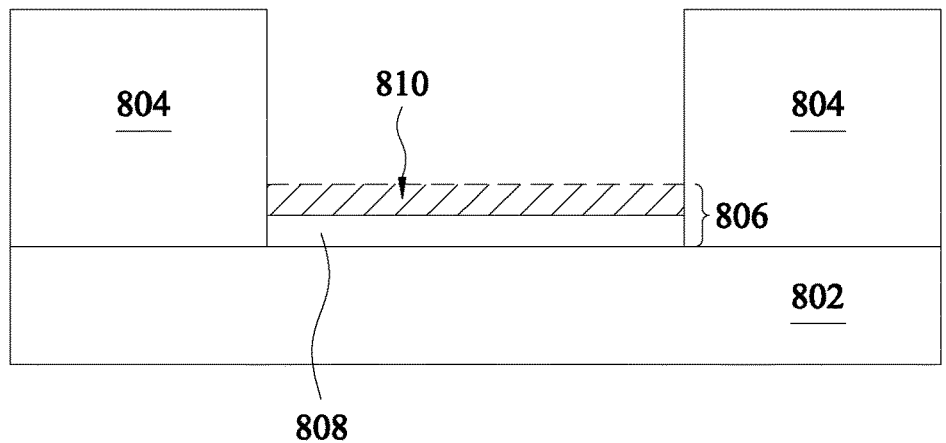

Referring to FIGS. 7 and 8B, the method 700 proceeds to operation 708 with forming a first orientation layer 808. In the example of the orientation material is formed of the polymers 902 and 904 with respect to FIG. 9, as illustrated in FIG. 8C, an orientation layer 808 is formed on the top surface 803 of the substrate, wherein the orientation layer 808 is formed of the first polymer 902. By applying the treatment 807 on the substrate, the first polymer 902 terminated with the functional group 903 that includes a hydrophilic group may be more reactive to attach to the top surface 803 while the portion of the orientation material formed of the second polymer 905 may float above the orientation layer 808. That is, during the formation of the orientation layer 808, another portion of the orientation material (i.e., the portion formed of the second polymer 904)

may float above the formed orientation layer 808, which is illustrated as 810 in FIG. 8B. In some embodiments, the portion 810 has not been formed as an orientation layer yet in operation 708. In some embodiments, the orientation layer 808 may have a thickness ranging between about 5 nanometers to about 10 nanometers.

Figure 8D:
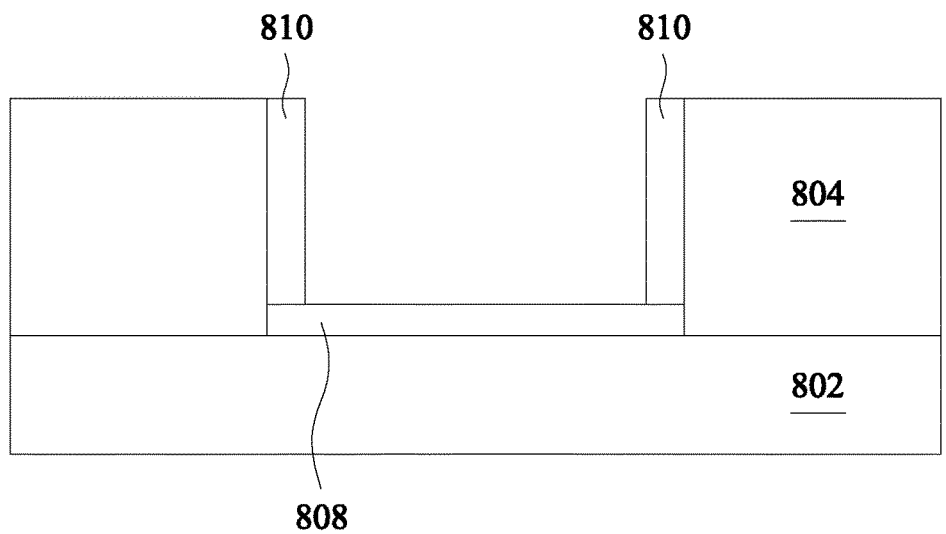

The method 700 continues to operation 710 with forming a second orientation layer. Continuing with the above example in which the orientation material is formed of the polymers in FIG. 9, a second orientation layer 810' that is formed of the second polymer 904 is formed on the sidewall 805 by baking the substrate to temperature between about 180° C. and about 250° C. as illustrated in the embodiment of FIG. 8D.

Figure 8E:
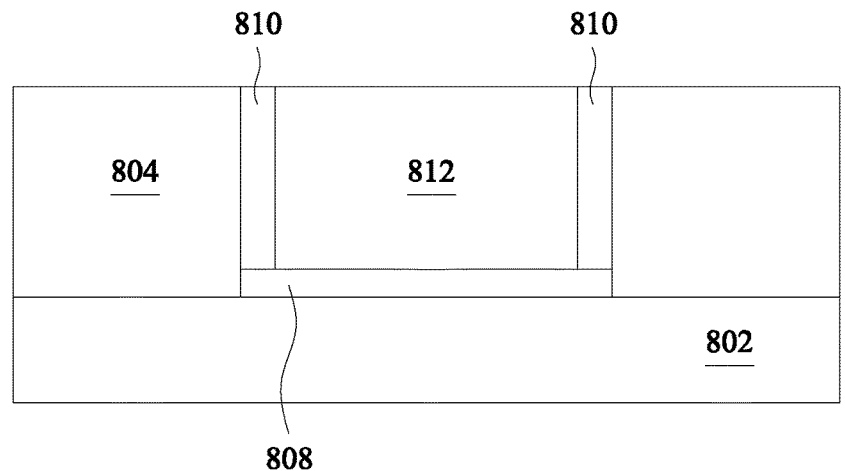
Figure 8F:
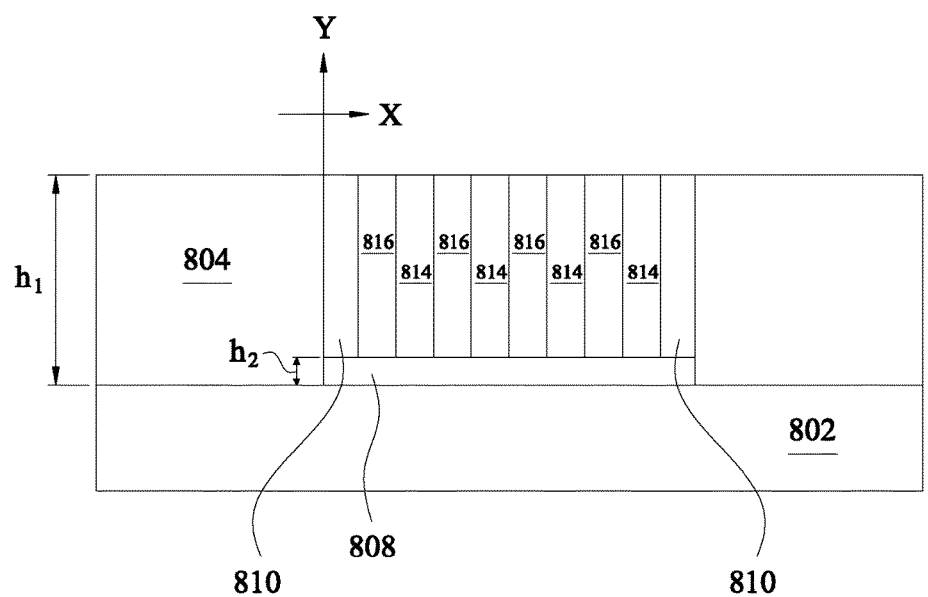

The method 700 proceeds to operation 712 with performing a directed self-assembly (DSA) process. In some embodiments, the operation 712 may include multiple processes in the following order: depositing a directed self-assembly (DSA) block copolymer (BCP) layer 812 over the first orientation layer 808 and the second orientation layer 810 (as illustrated in FIG. 8E); applying an elevated temperature to anneal the BCP layer 812 thereby achieving segregation in the BCP layer 812 to form first and second polymer nanostructures, 814 and 816 (as illustrated in FIG. 8F). Generally, a BCP material includes polymers comprised of at least two different polymer segments, and these polymer segments can assemble themselves into highly ordered structures under certain conditions, such as when they are exposed to an elevated temperature. In the current embodiment, the BCP layer 812 may include one or more of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyviny.

Still referring to FIGS. 7 and 8F, during the DSA process (i.e., operation 712), by choosing the height of the pattern 804 (i.e., $h_1$), the height of the first orientation layer 808 (i.e., $h_2$), and the materials of the BCP layer 812, the first and second polymer nanostructures 814 and 816 are formed such that they have a height approximately same as the difference of the heights $h_1$ and $h_2$, they are parallel to each other. In the illustrated embodiment of FIG. 8F, the first and second polymer nanostructures 814 and 816 are aligned along direction X, and each of them extends in a direction (i.e., Y axis in FIG. 8F) that is parallel to the sidewall 805. However, the BCP layer 812 may be formed into a variety of shapes that are regularly aligned such as for example, a sphere, a cylinder, a lamellae, and any suitable shape known in the art. The formed polymer nanostructures 814 and 816 may be later used as a pattern for a further fabrication step. In an example, one of the polymer nanostructures (e.g., 814) may be etched away and the other polymer nanostructure (e.g., 816) may be left on the substrate as a hard mask layer to transfer a pattern onto the substrate thereby reaching a finer critical dimension (CD).

Although in the above discussion and embodiments, the first polymer (e.g., 303, 603, and 903) is to form the first orientation layer on the top surface of the substrate (e.g., 203, 503, and 803) first and then the second polymer (e.g., 305, 605, and 905) is to form the second orientation layer on the sidewall of the pattern (e.g., 205, 505, and 805), in some alternative embodiments, the first orientation layer formed of the first polymer may be formed on the sidewall of the pattern first and the second orientation layer formed of the second polymer may be later formed on the top surface of the substrate. For example, if the sidewall 205 has a more reactive surface than the top surface 203, the first polymer 302 with the lower activation energy may form a first orientation layer on the sidewall 205 by baking at a lower temperature and then the second polymer 304 with the higher activation energy may later from another orientation layer on the top surface by baking at a higher temperature.

Although not intended to be limiting, one or more embodiments of the present disclosure provide many benefits to a semiconductor device and the formation thereof. For example, embodiments of the present disclosure provide methods for forming densely packed DSA patterns with uniformity and precision by using only one orientation material for a DSA process. In some embodiments, the orientation material may be formed into two orientation layers and each of the orientation layers is configured to guide a DSA process of one of the polymer segments of a BCP material. Without requiring a complicated patterning process and/or an additional material, such two orientation layers may be formed on respective surface. Additionally, embodiments of the present disclosure can be easily integrated into existing fabrication flow. In addition, even though two DSA processes are illustrated above, embodiments of the present disclosure may include more than two DSA processes where one builds upon another accumulatively.

In one exemplary aspect, the present disclosure is directed to a method of forming a semiconductor device. The method includes forming a patterned feature over a substrate; applying an orientation material that includes a first polymer and a second polymer over the substrate, wherein the first polymer has a first activation energy and the second polymer has a second activation energy; baking the substrate at first temperature thereby forming a first orientation layer that includes the first polymer; baking the substrate at second temperature thereby forming a second orientation layer that includes the second polymer; and performing a directed self-assembly (DSA) process over the first and the second orientation layers.

In another exemplary aspect, the present disclosure is directed to a method of forming a semiconductor device. The method includes providing a substrate having a patterned feature formed thereon; applying an orientation material that includes a first polymer and a second polymer over the substrate, wherein the first polymer is terminated with a first functional group and the second polymer is terminated with a second functional group; forming a first orientation layer that includes the first polymer on the substrate and forming a second orientation layer that includes the second polymer on the patterned feature; and performing a directed self-assembly (DSA) process over the first and the second orientation layers.

In another exemplary aspect, the present disclosure is directed to a method of forming a semiconductor device. The method includes providing a substrate having a patterned feature formed thereon; treating the substrate thereby causing a first portion of the substrate to be hydrophilic; applying an orientation material that includes a first polymer and a second polymer over the substrate, wherein the first polymer is terminated with a first functional group and the second polymer is terminated with a second functional group; forming a first orientation layer that includes the first polymer over the first portion of the substrate and forming a second orientation layer that includes the second polymer over the patterned feature; and performing a directed self-assembly (DSA) process over the first and the second orientation layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a patterned feature over a substrate,
    applying an orientation material that includes a first polymer and a second polymer over the substrate, wherein the first polymer has a first activation energy and the second polymer has a second activation energy;
    baking the substrate at first temperature thereby forming a first orientation layer that includes the first polymer;
    baking the substrate at second temperature thereby forming a second orientation layer that includes the second polymer; and
    performing a directed self-assembly (DSA) process over the first and the second orientation layers, wherein performing the DSA process includes:
        depositing a copolymer material over the first and the second orientation layers, wherein the copolymer material is directed self-assembling; and
        inducing microphase separation within the copolymer material thereby defining a first constituent of the copolymer material and a second constituent of the copolymer material.

2. The method of claim 1, wherein the copolymer material includes one or more materials from a group consisting of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

3. The method of claim 1, wherein the first activation energy is lower than the second activation energy and the first temperature is lower than the second temperature.

4. The method of claim 1, wherein a thickness of the first orientation layer that includes the first polymer ranges between about 5 nanometers and about 10 nanometers.

5. The method of claim 1, wherein the first temperature ranges between about 80° C. and about 150° C., and the second temperature ranges between about 180° C. and about 250° C.

6. The method of claim 1, wherein the first polymer includes a backbone that includes a hydroxyl group with a first amount of carbon side chains and the second polymer includes a backbone that includes a hydroxyl group with a second amount of carbon side chains, the first amount being greater than the second amount.

7. A method comprising:
    providing a substrate having a patterned feature formed thereon;
    applying an orientation material that includes a first polymer and a second polymer over the substrate;
    forming a first orientation layer that includes the first polymer by baking the substrate and orientation material at a first temperature;
    forming a second orientation layer that includes the second polymer from a portion of the orientation material floating over the first orientation layer by baking the substrate at a second temperature higher than the first temperature; and
    performing a directed self-assembly (DSA) process over the first and the second orientation layers, wherein performing the DSA process includes:
        depositing a copolymer material over the first and the second orientation layers, wherein the copolymer material is directed self-assembling; and
        inducing microphase separation within the copolymer material thereby defining a first constituent of the copolymer material and a second constituent of the copolymer material.

8. The method of claim 7, further comprising forming the second orientation layer directly on a sidewall of the patterned feature and directly over the first orientation layer.

9. The method of claim 7, wherein a thickness of the first orientation layer that includes the first polymer ranges between about 5 nanometers and about 10 nanometers.

10. The method of claim 7, wherein the first temperature ranges between about 80° C. and about 150° C., and the second temperature ranges between about 180° C. and about 250° C.

11. The method of claim 7, wherein the first polymer includes a backbone that includes a hydroxyl group with a first amount of carbon side chains and the second polymer includes a backbone that includes a hydroxyl group with a second amount of carbon side chains, the first amount being greater than the second amount.

12. The method of claim 7, wherein the copolymer material includes one or more materials from a group consisting of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

13. A method comprising:
    providing a substrate having a patterned feature formed thereon;
    applying an orientation material that includes a first polymer and a second polymer over the substrate;

forming a first orientation layer that includes the first polymer over a first portion of the substrate by baking the substrate at a first temperature;

forming a second orientation layer that includes the second polymer over a second portion of the substrate including by baking the substrate at a second temperature higher than the first temperature; and performing a directed self-assembly (DSA) process over the first and the second orientation layers, wherein performing the DSA process includes:

depositing a copolymer material over the first and the second orientation layers, wherein the copolymer material is directed self-assembling; and inducing microphase separation within the copolymer material thereby defining a first constituent of the copolymer material and a second constituent of the copolymer material.

14. The method of claim 13, further comprising forming the second orientation layer from a floating portion of the orientation material directly on a sidewall of the patterned feature and directly over the first orientation layer.

15. The method of claim 13, wherein the first polymer includes a hydroxyl functional group.

16. The method of claim 13, wherein treating the substrate includes applying a plasma-assisted dry etching process by flowing $N_2/H_2$ or $O_2$.

17. The method of claim 16, wherein applying the plasma-assisted dry etching process includes applying the plasma-assisted dry etching process at a temperature ranging from about 0° C. to about 80° C. and at pressure ranging from about 10 millitorr (mT) to about 60 mT.

18. The method of claim 13, wherein the second polymer includes a hydroxyl functional group.

* * * * *